United States Patent [19]

Holt et al.

[11] 4,350,952

[45] Sep. 21, 1982

[54] DIGITAL READ-OUT METER CIRCUIT AND TACHOMETER WITH VARIABLE METER UPDATE RATE USING AN UP/DOWN COUNTER MEANS

[75] Inventors: James L. Holt, Bristol, Wis.; Robert P. Otka, Gurnee, Ill.

[73] Assignee: Outboard Marine Corporation, Waukegan, Ill.

[21] Appl. No.: 90,984

[22] Filed: Nov. 5, 1979

[51] Int. Cl.³ .................... G01P 3/48; G01P 3/54; G01R 23/02; G06G 7/00

[52] U.S. Cl. .................... 324/166; 324/78 D; 235/92 EV

[58] Field of Search .............. 324/78 D, 166, 168, 324/169, 173, 174, 175; 235/92 F, 92 T, 92 TF, 92 EV

[56] References Cited

U.S. PATENT DOCUMENTS

| | | | |
|---|---|---|---|
| 3,531,727 | 9/1970 | Hall | 324/78 D |
| 3,863,153 | 1/1975 | Eshraghian | 324/166 |
| 3,868,570 | 2/1975 | Kopera, Jr. | 324/166 |
| 4,031,466 | 6/1977 | Krause et al. | 324/166 |
| 4,140,970 | 2/1979 | Graziano | 324/166 |

Primary Examiner—Gerard R. Strecker

Assistant Examiner—Walter E. Snow

Attorney, Agent, or Firm—Michael, Best & Friedrich

[57] ABSTRACT

Disclosed herein is a digital read-out meter circuit including a digital read-out meter and a frequency multiplier arrangement for providing signal pulses coupled to the input of the digital meter counters, said signal pulses having a frequency so that the parameter value to be displayed can be counted and read out directly by the meter. A presetable up/down counter provides an output representative of the rate of change of the parameter value to be displayed, and a logic circuit arrangement is operable, subject to the up/down counter output, for allowing application of different frequency data update pulses to the data update strobe terminal of the meter so that the meter automatically switches from a slow to a fast data update rate when the rate of change in the parameter exceeds a predetermined limit. Also disclosed herein is a tachometer which can be used with different engines, the tachometer including a digital read-out meter circuit wherein the frequency multiplier arrangement includes selective switching means for multiplying "X" number of pulses per engine revolution by different numbers so that engine rpm of different engines can be counted and read out directly by the digital meter.

24 Claims, 2 Drawing Figures

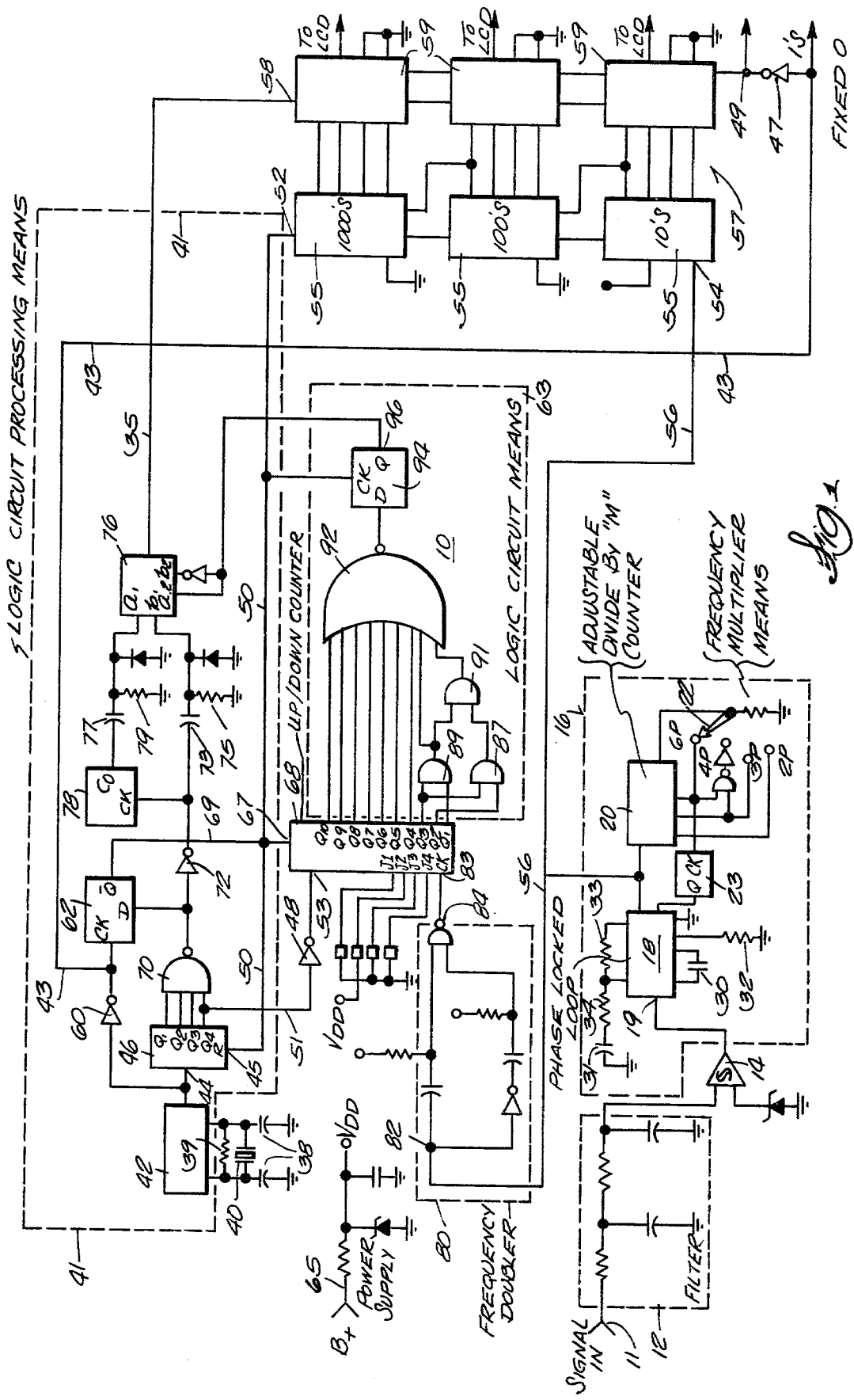

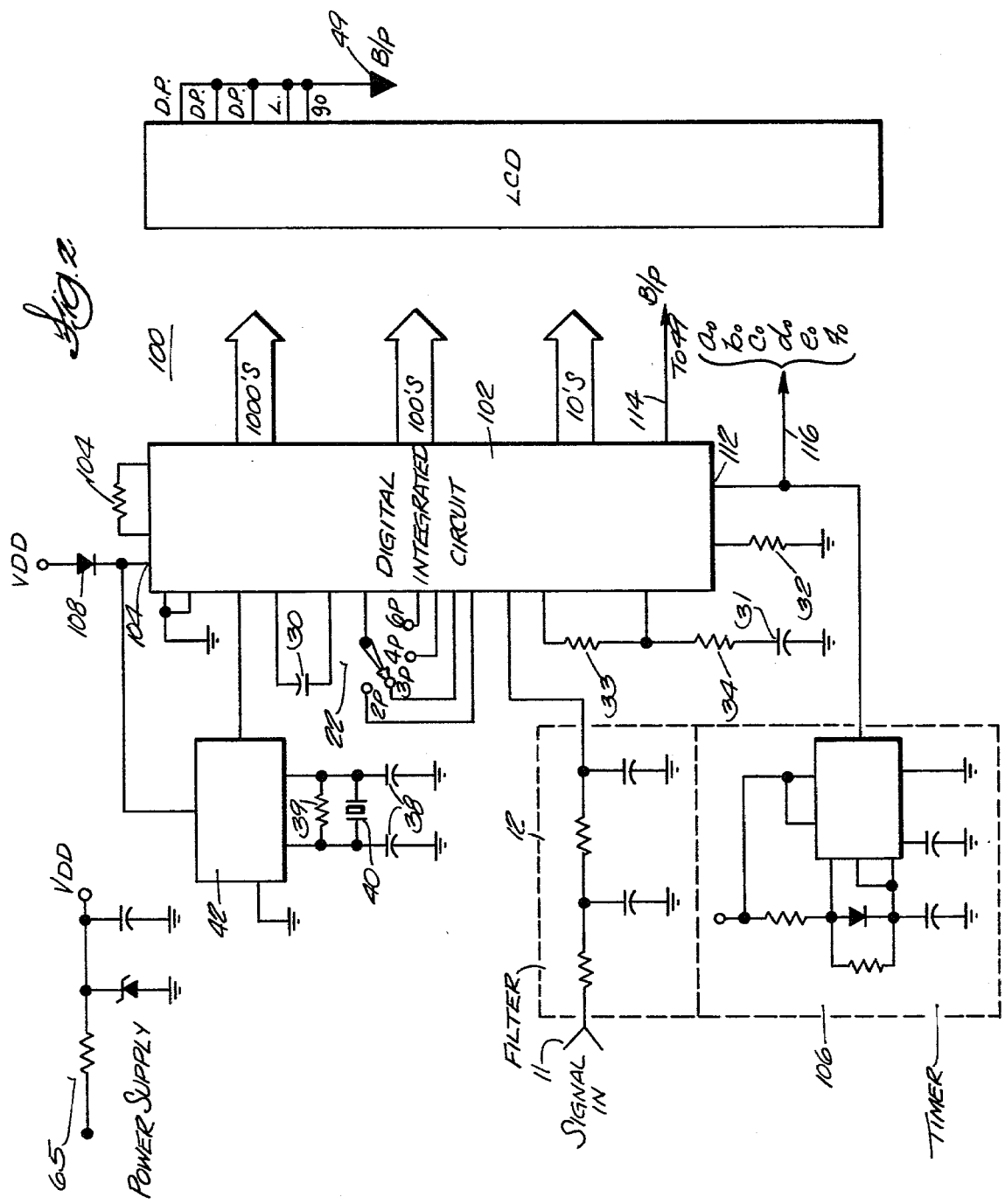

DIGITAL READ-OUT METER CIRCUIT AND TACHOMETER WITH VARIABLE METER UPDATE RATE USING AN UP/DOWN COUNTER MEANS

FIELD OF THE INVENTION

The invention relates generally to electronic measurement devices having a digital read-out meter which indicates the value of an input parameter to be measured, and more particularly, to such devices which include circuitry to vary the data update rate of the digital read-out meter in response to the rate of change of the value of the input parameter measured. In particular, the invention also relates to tachometers including circuitry to provide a digital display of engine rpm.

DESCRIPTION OF THE PRIOR ART

Attention is directed to the following U.S. Pat. Nos.
Eshraghian—3,863,153—Jan. 28, 1975
Russell—3,803,486—Apr. 9, 1974
Kopera—3,868,570—Feb. 25, 1975

SUMMARY OF THE INVENTION

The invention provides a digital read-out meter circuit having a variable meter data update rate. The circuit comprises a digital read-out meter having counters with an input for receiving signal pulses having a frequency representative of a parameter value to be displayed by the meter, and having a counter reset terminal and a data update strobe terminal, up/down counter means having an input for receiving a series of pulses having a frequency representative of the parameter value to be displayed, and operative for providing an output representative of the rate of change of the parameter value to be displayed, and logic circuit means subject to the up/down counter means output for controlling selective application of different frequency data update pulses to the data update strobe terminal to provide the meter with a variable data update rate.

In one embodiment of the invention, the up/down counter means is operative subject to a reset signal, for counting up for ½ of a predetermined counting interval, and for counting down for ½ of the predetermined counting interval. In this embodiment the up/down counter means is preferably presetable and has a preset count number, and the logic circuit means is operable for allowing application of first frequency data update pulses to the data update strobe terminal to provide the meter with a first data update rate when the counter means counts down through zero or has a count in excess of twice the predetermined count number, and for allowing application of second frequency data update pulses to the data update strobe terminal to provide the meter with a second data update rate when the counter means has a count in the range of zero to twice the predetermined count number.

In one embodiment of the invention, the digital read-out circuit further comprises frequency multiplier means for receiving a series of initial pulses having a frequency representative of the value of the parameter value to be displayed, and for multiplying the frequency of the initial pulses to generate the signal pulses which are coupled to the input of the meter counters, the signal pulses being generated so as to have a frequency so that the parameter value is counted and can be read out directly by the meter. In this embodiment, the frequency multiplier means preferably comprises a phase-locked loop having an input for receiving the initial pulses and having an output for generating the signal pulses, the frequency multiplier means further comprising frequency divider means coupled to the phase-locked loop so that the frequency of the output of the phase-locked loop is "N" times the frequency of the initial pulses. Also in this embodiment of the invention, the meter counters preferably count for a given time period defined by the end of a frequency reset signal applied to the counter reset terminal and the beginning of the first frequency update pulse, and the frequency divider means is adjustable and selectively operative for adjusting the value of the number "N" by which the input of the phase-locked loop is multiplied so that, for the given time period, the parameter value is counted and can be read out directly by said meter.

In one embodiment of the invention, the predetermined count number of the presetable up/down counter means is 2, and logic circuit means allows application of the first frequency data update pulses when the counter counts through zero or has a count equal to or greater than 5.

In one embodiment of the invention, the digital read-out circuit further comprises second frequency multiplier means for increasing the frequency of the signal pulses coupled to the input of the up/down counter means to increase the resolution of the up/down counter means so that the output of the counter means is more sensitive to a rate of change in the parameter value to be displayed.

The invention also provides a tachometer comprising a digital read-out meter circuit having a variable meter data update rate. The circuit includes a digital read-out meter having counters with an input for receiving signal pulses having a frequency representative of engine rpm to be displayed by the meter, and having a counter reset terminal and a data update strobe terminal, up/down counter means having an input for receiving a series of pulses having a frequency representative of engine rpm, and operative for providing an output representative of the rate of change in the engine rpm, and logic circuit means subject to the up/down counter means output for controlling selective application of different frequency data update pulses to the data update strobe terminal to provide the meter with a variable data update rate.

The tachometer, in one embodiment of the invention, further comprises frequency multiplier means for receiving "X" number of pulses per engine revolution and for multiplying the frequency of the "X" number of pulses to generate the signal pulses which are coupled to the input of the meter counters, the signal pulses being generated so as to have a frequency so that engine rpm is counted and can be read out directly by the meter. In this embodiment the meter counters preferably count for a given time period, and the frequency multiplier means is adjustable and operative for multiplying the "X" number of pulses per engine revolution so that, for said given time period, the engine rpm is counted and can be read out directly by the meter.

The tachometer, in one embodiment of the invention, preferably includes a digital read-out circuit wherein the digital meter includes a fixed one's digit, and a ten's digit counter having an input for receiving the signal pulses, and wherein the frequency multiplier means includes switching means and is operable for multiplying the "X" number of pulses per engine revolutions so that engine rpm can be read out directly by the meter and wherein the "X" number of pulses per engine revolution can be equal to one of, two pulses per engine revolution, three pulses per engine revolution, four pulses per engine revolution, and six pulses per engine revolution.

In one embodiment of the invention, the digital read-out meter circuit further includes an oscillator, and logic circuit processing means for generating the reset signal and for generating the first frequency data update pulses and the second frequency data update pulses, the processing means including AND/OR select gate means, subject to application of a control signal from the logic circuit means, for selectively coupling one of the first frequency data update pulses or the second frequency data update pulses to the data update strobe terminal so that the meter has a fast update rate when the rate of change of the parameter to be displayed or rpm exceeds a predetermined limit, and so that the meter has a slow data update rate when the rate of change of the rpm does not exceed the predetermined limit. In this embodiment the up/down counter means is preferably presetable and has a predetermined count number of 2, and the logic circuit means applies a control signal to the AND/OR select gate means so that the first frequency data update pulses are applied to the data update strobe terminal so that the meter has a fast data update rate when the counter counts through zero or has a count equal to or greater than five.

One of the principal features of the invention is the provision of a digital read-out meter circuit having a digital read-out meter and which includes up/down counter means operative, along with other components of the meter circuit, so that the digital read-out meter has a variable meter update rate which changes in response to the rate of change of the value of the parameter to be displayed by the digital meter.

Another of the principal features of the invention is the provision of a tachometer incorporating such a digital read-out meter circuit. The digital read-out circuit preferably includes frequency multiplier means for receiving "X" number of pulses per engine revolution and for multiplying the frequency of the "X" number of pulses to generate signal pulses coupled to the input of the counters of the digital meter so that engine rpm can be counted and read out directly by the meter.

Another of the principal features of the invention is the provision of such a tachometer wherein the up/-down counter means is presetable and has a preset count number, and wherein the digital read-out circuit includes logic circuit means operable for selectively allowing application of different first and second frequency data update pulses to the data update strobe terminal of the digital meter so that the meter has a fast data update rate when the rate of change of rpm exceeds a predetermined limit, and so that the digital meter has a slow data update rate when the rate of change of rpm does not exceed the predetermined limit.

Another of the principal features of the invention is the provision of a tachometer which can be utilized with engines having different transducer arrangements providing different numbers of pulses per engine revolution. To this end, the frequency multiplier means of the digital read-out circuit preferably includes switching means selectively operable for multiplying the "X" number of pulses per engine revolution so that the engine rpm can be read out directly by the digital meter when the "X" number of pulses per engine revolution is equal to, for example, two pulses, three pulses, four pulses, or six pulses per engine revolution.

Other features and advantages of the embodiments of the invention will become known by reference to the following general description, claims, and drawings.

DESCRIPTION OF THE DRAWINGS

FIG. 1 is a schematic block diagram of a digital read-out meter circuit embodying various of the features of the invention;

FIG. 2 is a schematic block diagram of a digital read-out meter circuit similar to the circuit of FIG. 1, except several of the discrete components shown in the circuit of FIG. 1 have been included in a digital integrated circuit.

Before explaining the embodiments of the invention in detail, it is to be understood that the invention is not limited in its application to the details of construction and arrangements of components set forth in the following description or illustrated in the drawings. The invention is capable of other embodiments and of being practiced and carried out in various ways. Also, it is to be understood that the phaseology and terminology employed herein is for the purpose of description and should not be regarded as limiting.

GENERAL DESCRIPTION

Shown in FIG. 1 is a digital read-out meter circuit, generally designated 10, having a variable meter update rate and embodying various of the features of the invention. Generally, the circuit 10 operates to provide a digital read-out of the value of a parameter to be measured in response to a series of pulses coupled to the input terminal 11 of the meter circuit 10, the frequency of the pulses being representative of the value of the parameter to be measured. For purposes of example, and in the preferred construction illustrated, the meter circuit 10 operates as a tachometer. Thus, the input 11 of the digital read-out meter circuit 10 receives a series of pulses (not shown) proportional to engine rpm.

As will be described in more detail below, the meter circuit 10 includes a conventional digital read-out meter, generally designated 57. The variable meter update rate feature of the circuit 10 is operative so that during rapid changes of the parameter (rpm) measured, the data update period is short, (e.g., ¼ second) thereby allowing an operator to observe the rapid changes in rpm. When the value of the parameter or rpm measured is constant or changing slowly, the update period is automatically adjusted to be relatively long, (e.g., 2 seconds) thereby preventing the annoyance and fatigue that a sustained rapid data update causes the viewer.

Turning to a more detailed description of the components and operation of the digital read-out meter circuit 10, "X" number of pulses per engine rpm, for example, 6 pulses per engine revolution, are coupled to the input terminal 11 and transmitted through a filter, generally designated 12, to the input of a Schmitt trigger 14. The Schmitt trigger 14 filters out noise and transmits the rpm signal pulses to the input of an adjustable frequency multiplier means, generally designated 16. The output of the frequency multiplier means 16 is transmitted by a line 56 to the input terminal 54 of three decade counters 55 included in the digital read-out meter generally designated 57.

As noted above, the digital read-out meter 57 is conventional in nature, and includes decoder-drivers, designated 59, which are connected to the corresponding decade counters 55. The decoder-drivers 59 include strobe latching circuitry, and have outputs which drive a four digit liquid crystal display (LCD) which completes the meter 57 (shown in FIG. 2). The digital meter 57 includes a counter reset terminal 52 which, as will be further described, receives reset signals of a given frequency so that the counters 55 count during a specified interval, for example, during ¼ second intervals. The number counted at the end of the ¼ second interval is transferred to the decoder-drivers 59 for display by the LCD, the transfer being subject to data update strobe pulses applied to a meter date update strobe terminal 58, connected to the decoder-drivers 59. As will be further described below, in the preferred construction, these data update strobe pulses have different frequencies dependent upon the rate of change of the parameter or rpm to be displayed, for example, a data update pulse is applied to the strobe terminal once every ¼ second (fast data update) or once every 2 seconds (slow data update) dependent upon the rate of change of engine rpm.

Returning to a description of the frequency multiplier means 16, the rpm signal pulses fed to the frequency multiplier means 16 are multiplied by a number "N" so that the number of signal pulses applied to the ten's decade counter 55, within the ¼ second counting intervals, causes the LCD to read out engine rpm directly. The digital meter 57 has a fixed one's digit connected to provide a fixed zero display, so that the output from the frequency multiplier should be equal to 1/10 times engine rpm in a ¼ second. Assuming for purposes of example, that the rpm signal pulses are provided by an engine alternator which provides six pulses per engine revolution, the number "N" by which the six pulses per engine revolution must be multiplied so that the digital meter 57 reads the signal output pulses directly in rpm in four, or N=4.

Various frequency multiplier means arrangements could be utilized. As shown in the illustrated construction, such means preferably comprises a phase-locked loop 18 having an input 19 coupled to the output of the Schmitt trigger 14, and frequency divider means such as a divide by "M" counter 20 and a flip-flop 23 included in the negative feed back loop of the phase-locked loop 18. The operation of a phase-locked loop is well covered in the literature, see, for example, RCA Cos/Mos Integrated Circuits, SSD-203C, 1975 Data-book Series, pp. 277–288, RCA Somerville, N.J. 1974.

Basically, the phase-locked loop 18 has its own internal voltage controlled oscillator (not specifically shown) which locks onto the signal pulses applied to the input 19. As shown in the illustrated construction in FIG. 1, an adjustable divide by "M" counter 20 is preferably connected in the feedback loop of the phase-locked loop, along with flip-flop 23, so as to be placed between the internal voltage controlled oscillator and the internal comparator circuits of the phase-locked loop. This results in the loop oscillator running at a frequency "N" times that of the input frequency, where the value of "N" is 2"M" determined by operation of switch means or a switch 22 connected to the terminals of the counter 20 with a NAND gate and an inverter as shown. For example, when the switch 22 is connected to the terminal labelled "6p", (corresponding to the input 19 receiving 6 pulses per engine revolution) the divide by "M" counter and the flip-flop 23 operate together so that the frequency of the output of the phase-locked loop 2 "M" or "N" times the frequency of the rpm signal pulses where "N" is equal to four, as discussed above, so that LCD reads directly in rpm. The switch 22 is operative so that when connected to the terminal labelled 4p, the frequency of the output of the phase-locked loop is 6 times greater than the frequency of the rpm signal pulses. When the switch 22 is connected to the terminal 3p, a multiplication of 8 occurs, and when the switch 22 is connected to the terminal labelled 2p, a multiplication of 12 occurs, again, in each instance, so that the digital meter 57 and LCD count and read out engine rpm directly. Capacitors 30 and 31, and resistors 32, 33, and 34, are conventionally connected to the phase-locked loop as shown.

This adjustable frequency multiplier means feature allows the circuit or tachometer 10 to be utilized with internal combustion engine arrangements having transducers or other arrangements which provide 6, 4, 3, or 2 pulses per engine revolution. Relating the circuit 10 to marine engine use, outboard motors having power in excess of 60 horsepower, for example, generally have 6 pulses per engine revolution provided by an alternator. The terminals marked 4p, 3p, and 2p correspond to 4 pulses, 3 pulses and 2 pulses per engine revolution, and these terminals can be used for example, with signal pulses provided from the points produced by 4-cycle, 8 cylinder, 6 cylinder, and 4 cylinder stern drive engines.

As noted earlier, the count period or time base for the counters of the digital meter is preferably ¼ second. This ¼ second time base is derived from a conventional quartz crystal oscillator 40 conventionally connected to a pair of capacitors 38 and a resistor 39, and connected to logic circuit processing means, generally designated 41 as shown. In addition to generating the reset signal, the processing means 41 generates first and second frequency data update pulses, which frequencies are selectively coupled to the data update strobe terminal 58.

More specifically, while various arrangements are possible, as shown in the illustrated construction, the processing means 41 includes a 17 stage frequency divider 42 coupled to the oscillator 40 and having an output of substantially reduced frequency, for example 60 cycles per second. This 60 cycle signal is transmitted through inverter 60 and via line 43 and inverter 47 to the back plane terminal 49 of the digital meter 57, to provide the LCD back plane drive. The 60 cycle output from the divider 42 is also fed to the input 44 of another frequency divider, for example a 12 stage binary ripple counter, designated 46, having four outputs coupled to a NAND gate 70, which divides the frequency by fifteen and provides an output pulse every ¼ second, subject to a reset signal applied to reset terminal 45 of the divider 46.

The ¼ second output pulses of the NAND gate 70 are provided to the "d" terminal of a dual D flip-flop 62 which has a clock input connected through invertor 60 to the 60 hertz output of the frequency divider 42. The reset signal is provided by the $\overline{Q}$ output of the flip-flop 62 in response to the ¼ second output pulse of the NAND gate 70. Specifically, the trailing edge of the output of the dual D flip-flop 62 provides the reset signal which defines the beginning of the time base for the counters 55 of the digital meter 57 via connection to the counter reset terminal 52 by line 50, and also provides the reset signal for the 12 stage counter 46, via connection to the reset input 45 by line 50.

In order to provide first frequency data update pulses, the quarter second pulses supplied from the output of the NAND gate 70 are inverted by invertor 72 and differentiated by capacitor 73 and resistor 75 to provide sharp quarter second pulses applied to the $b_1$ input of a quad AND/OR select gate 76. As will be further described below, when the rate of change of rpm exceeds a predetermined limit, these quarter second pulses are transferred through the select gate 76 subject to a control signal from logic circuit means 63, described below, and are applied to the strobe data update terminal 58 by line 35, to establish a fast data update rate.

The quarter second pulses transmitted through inverter 72 are also coupled to the clock input of a divide by 8 counter 78 which supplies an output pulse every 2 seconds at its output terminal, these 2 second output pulses being differentiated by capacitor 77 and resistor 79 and fed to the $a_1$ input of the select gate 76, to provide second frequency data update pulses. As will be explained below, if the rate of change of engine rpm is below a predetermined limit, the 2 second data update pulses are transferred through the select gate 76 and applied to the data update strobe terminal 58 of the decoder-drivers 59 to establish a relatively slow data update rate for the meter 57.

In order to automatically select either the fast or slow data update rate based upon the rate of change of the parameter or rpm being measured, the circuit 10 preferably includes up/down counter means and logic circuit means, generally designated 63, coupled to the output of the up/down counter means, and having an output coupled to the $a_2$ and $b_2$ inputs of the AND/OR select gate 76. If the rate of change of engine rpm is less than a predetermined limit, the output or control signal from the logic circuit means causes the AND/OR select gate 76 to transmit the slow data update pulses, one every 2 seconds. If the rate of change of rpm exceeds a predetermined upper limit, the control signal of the logic circuit means 63 causes the AND/OR select gate 76 to transmit the ¼ second data update strobe pulses to provide a fast data update rate.

More particularly, while various up/down counter means arrangements could be utilized, as shown in the illustrated construction such means preferably comprises an up/down counter, designated 68, including four least significant bits which are presetable. Specifically, the counter 68 includes preset input terminals J1, J2, J3, and J4 which allow presetting of the four least significant bits to any value asynchronously with the clock counter. As will be further described, the up/down counter 68 is preferably preset to the count of 2 by coupling the J2 input to a high signal or the output $V_{DD}$ of the power supply, generally designated 65 and conventionally made up of a resistor, a zener diode, and a capacitor, as shown in FIG. 1.

The up/down counter 68 is operative, subject to a reset signal applied to reset terminal 67, for counting up for ½ of a predetermined counting interval, and for counting down for ½ of the predetermined counting interval. In the preferred construction illustrated, the up/down counter 68 is operative to count up for 0.133 seconds and then count-down for 0.133 seconds prior to being reset. The 0.133 second count-up, count-down intervals are determined by a signal coupled by line 51 from the Q4 output of the divide by 8 counter 46 through inverter 48 to the up/down command input 53 of the counter 68. The overall counting interval is 0.266 seconds and is established by the reset signal coupled from the output of the flip-flop 62 to the reset terminal 67 of the counter 68 by line 69. The up/down counter means or counter 68 is operative for providing an output representative of the rate of change in the value of the parameter or rpm to be displayed.

More particularly, if the number of pulses counted during the count-up period is greater than the number of pulses counted during the count-down period, there has been a decrease in the engine rpm, and conversely, if the number of pulses counted during the count-down period is greater than the number of pulses counted during the count-up period, there has been an increase in engine rpm. The up/down counter 68 counts binarily and has ten outputs Q1–Q10 inclusive, each of which has a high or low output dependant on the binary value of the count of the counter 68 at the end of the 0.266 seconds counter interval. The up/down counter 68 can be made up, for example, of three RCA decade counters, Model No. CD 4029, cascaded and operative to count in a binary mode. In order for the counters to be operative as described, the signal at the up/down command input 53 has to be high simultaneously with the signal at the clock input 83 of the counter 68.

The lower three output terminals of the counter, Q1, Q2, and Q3 are connected to the logic circuit means 63, which preferably includes AND gates 87, 89 and 91, which AND gates have outputs connected to inputs of NOR gate 92, as illustrated. The remaining counter output terminals Q4 through Q10, are directly connected to inputs of NOR gate 92. The output of the NOR gate 92 is low if any of the inputs to the NOR gate are high. With the AND gates 87, 89, and 91 connected as illustrated, the output of NOR gate 92 is high if the count of the up/down counter 68 at the end of the 0.266 seconds count period is in the range of 0–4, indicating relatively little change in engine rpm, and is low if the final count of the counter goes through zero, or is 5 or greater, thereby indicating rapid change in engine rpm, for example, a change equal to or in excess of 56 rpm in ¼ second, resulting in the faster data update being selected for the digital meter.

Specifically, the AND gates 87, 89 and 91 prevent a high output from being transmitted from the counter outputs Q1, Q2 and Q3 to the NOR gate 92 for a count in the range of 0–4. The AND gate 89 detects a count of 5 and transmits a high output to NOR gate 92, while AND gate 87 detects a count of 6, and all of the AND gates detect a count of 7, so that the output of the NOR gate 92 is low. When the count goes through zero, i.e., when the engine rpm is increasing at a fast rate, the counter counts backward starting at its highest number, again resulting in the output of the NOR gate going low.

With the AND gates 87, 89 and 91 connected as described, the counter can be made more or less sensitive to either an increase or a decrease in the rate of change of rpm by changing the preset count of the counter. For example, if the counter is preset to the count of 1, the counter would be more sensitive to an increase in engine rpm, but less sensitive to a decrease in engine rpm.

Returning to the operation of the NOR gate 92 of the logic circuit means 63, a low output from the NOR gate 92 is coupled to the input of a dual D flip-flop 94 which has an output 96 coupled to the $a_2$ and $b_2$ inputs of the quad AND/OR select gate 76 as illustrated. The low output of the NOR gate causes the output of the flip-flop 94 to go low, when it is clocked by the reset signal previously described, which in turn enables the $b_1$ input of the select gate 76, which transmits quarter second data update pulses to the data update strobe terminal 58 of the decoder-drivers 59, so that the meter 57 is provided with a fast data update rate of ¼ second.

If the output of the NOR gate is high, indicating that all the outputs of the counter 68 and AND gates connected to the NOR gate are low, there has been a relatively low rate of change of rpm, and the output of the D flip-flop 94 is high, enabling the $a_1$ input of the select gate 76 so that gate 76 transmits a 2 second data update pulse to the update strobe terminal 58 of the decoder-drivers 59, so that the LCD is provided with a slow data update of 2 seconds. This data update rate of once every 2 seconds results in eliminating the annoying flash resulting from an update rate of ¼ second, when the rate of change of engine rpm is relatively low, and the fast data update rate is unnecessary. The output or control signal flip-flop 94, subject to the output of the up/down counter 68, thus is operative for controlling selective application of different frequency data update pulses to the data update strobe terminal to provide the meter 55 with a variable data update rate.

The meter circuit 10 preferably includes second frequency means, preferably a frequency doubler, generally designated 80, conventionally made up of the components illustrated, and which has an input 82 coupled to the output of the phase-locked loop by line 56, and an output 84 coupled to the clock input 83 of the up/down counter 68. This frequency doubler 80 is provided to increase the resolution of the up/down counter 68, so that the output of the counter is more sensitive to changes in the rate of change of engine rpm.

The digital logic and other components which have been described and which make up the digital read-out meter circuit 10 can be made up of separately available commercial components. For example, portions of the circuit 10 can be built with RCA Cos/Mos devices having model numbers which correspond to the numbers of the components shown in FIG. 1, as follows:

Phase-locked Loop 18: CD 4046
Divide by "M" Counter 20: CD 4018
Decade Counters 55: CD 4518 and
Decoder Drivers 57: CD 4056
12 Stage Counter 56: CD 4040
Dual D Flip-Flops, 62 and 94: CD 4013
Divide by 8 Counter 78: CD 4022
Quad AND/OR Select Gate 76: CD 4019

The quartz crystal 40 has a frequency of 3,579,545 Mega Hz. and is manufactured and marketed under Model No. 333R05-001 by Electra Dynamics Corp., located in Shawnee Mission, Kans. The divider 42 is manufactured by National Semiconductors, Inc. under Model No. MM5369N.

Shown in FIG. 2 is a digital read-out meter circuit 100 having substantially the same operation as the meter circuit 10 of FIG. 1. FIG. 2, illustrates that if desired, many of the discrete circuit components and logic elements described with respect to the circuit of FIG. 1 can be incorporated or internalized in a digital integrated circuit, designated 102, in accordance with standard practice. The components which remain external have numbers corresponding to the numbers identifying these components in FIG. 1. For example, capacitors 30 and 31, and resistors 32, 33, and 34, connected to the phase-locked loop in FIG. 1, remain external to the integrated circuit 102 as shown in FIG. 2. Also the meter circuit 100 includes a resistor 104 which operates as a shunt, and corresponds to the connection between the Q output 96 of the flip-flop 94 and the $a_1$ and $b_1$ inputs of the AND/OR select gate 76.

In order to have a compatible back plane drive when using the IC 102, a timer, generally designated 106, is provided for connection to an input 112 of IC 102, which in turn provides an output on line 114 which is connected to the back plane (B/p) terminal 49 of the LCD display, as illustrated in FIG. 2. The line 43 shown in FIG. 1 is eliminated. Specifically, in the preferred construction illustrated, a National Semiconductor, timer Model No. LM55CM is provided including conventional connection to resistors, capacitors, and a diode (not specifically labelled) so that, a 60 hertz output is connected to the back plane terminal of the LCD. The LCD utilized with the meter circuit 100 of FIG. 2 is a four decade LCD Model No. 7554 manufactured by Liquid Crystal Displays, Inc., a subsidiary of Dicky-John Corp., 24500 Highpoint Rd., Cleveland, Ohio.

As illustrated, the LCD decimal point and colon ("L") connections are connected to the back plane terminal so they do not appear on the output of the LCD. Also, the $g_0$ segment or the 7th segment of the one's display is coupled to the back plane, so that the other 6 segments, $a_0$ through $f_0$, inclusive, which are connected directly to the 60 hertz output of the timer 106 by line 116, are energized to form a zero. Thus, the one's digit of the tachometer remains a fixed zero.

A power supply 65 is connected to the input 110 of the IC 102 and is made up of a resistor, a zener diode, and a capacitor (not specifically labelled) to supply a regulated 10 volts DC. The power supply can be coupled to a standard 12 volt battery utilized in connection with an internal combustion engine (not shown). A diode 108 is connected between the power supply and the input 110 of IC 102. The diode 108 has a voltage drop across it of approximately 0.7 volts so that the voltage supplied to the input 110 of IC 102 is approximately 9.3 volts.

It is to be understood that the invention is not confined to the particular construction and arrangement of circuit components herein illustrated and described, but embraces all such modified forms thereof as come within the scope of the following claims.

We claim:

1. A digital read-out meter circuit having a variable meter data update rate, said circuit comprising a digital read-out meter having counters with an input for receiving signal pulses having a frequency representative of a parameter value to be displayed by said meter, and having a counter reset terminal and a data update strobe terminal, up/down counter means having an input for receiving a series of pulses having a frequency representative of the parameter value to be displayed, and operative for providing an output representative of the rate of change of the parameter value to be displayed, and logic circuit means subject to said up/down counter means output for controlling selective application of different frequency data update pulses to said data update strobe terminal to provide said meter with a variable data update rate.

2. A circuit in accordance with claim 1, wherein said up/down counter means is operative subject to a reset signal, for counting up for ½ of a predetermined counting interval, and for counting down for ½ of the predetermined counting interval.

3. A circuit in accordance with claim 2, wherein said up/down counter means is presetable and has a preset count number, and wherein said logic circuit means is operable for allowing application of first frequency data update pulses to said data update strobe terminal to provide said meter with a first data update rate when said counter means counts down through zero or has a count in excess of twice the predetermined count number, and for allowing application of second frequency data update pulses to said data update strobe terminal to provide said meter with a second data update rate when said counter means has a count in the range of zero to twice the predetermined count number.

4. A circuit in accordance with claim 1 further comprising frequency multiplier means for receiving a series of initial pulses having a frequency representative of the value of the parameter value to be displayed, and for multiplying the frequency of said initial pulses to generate said signal pulses which are coupled to said input of said meter counters, said signal pulses being generated so as to have a frequency so that the parameter value is counted and can be read out directly by said meter.

5. A circuit in accordance with claim 4, wherein said frequency multiplier means comprises a phase-locked loop having an input for receiving said initial pulses and having an output for generating said signal pulses, said frequency multiplier means further comprising frequency divider means coupled to said phase-locked loop so that the frequency of the output of said phase-locked loop is "N" times the frequency of said initial pulses.

6. A circuit in accordance with claim 5, wherein said meter counters count for a given time period, and wherein said frequency divider means is adjustable and selectively operative for adjusting the value of the number "N" by which the input of the phase-locked loop is multiplied so that, for said given time period the parameter value is counted and can be read out directly by said meter.

7. A digital read-out meter circuit having a variable meter data update rate, said circuit comprising a digital read-out meter having counters with an input for receiving signal pulses having a frequency representative of a parameter value to be displayed by said meter, and having a counter reset terminal and a data update strobe terminal, frequency multiplier means for receiving a series of initial pulses having a frequency representative of the value of the parameter value to be displayed, and for multiplying the frequency of said initial pulses to generate said signal pulses which are coupled to said input of said meter counters, said signal pulses being generated so as to have a frequency so that the parameter value is counted and can be read-out directly by said meter, up/down counter means having an input coupled to said signal pulses, and operative for providing an output representative of the rate of change of the parameter value to be displayed, said up/down counter means being presetable and having a preset count number, and logic circuit means operable for allowing application of first frequency data update pulses to said data update strobe terminal to provide said meter with a first data update rate when said counter counts down through zero or has a count in excess of twice the predetermined count number, and for allowing application of second frequency data update pulses to said data update strobe terminal to provide said meter with a second data update rate when said counter means has a count in the range of zero to twice the predetermined count number.

8. A circuit in accordance with claim 7, wherein said predetermined count number is 2, and wherein said logic circuit means allows application of said first frequency data update pulses when said counter counts through zero or has a count equal to or greater than 5.

9. A circuit in accordance with claim 7, further comprising second frequency multiplier means for increasing the frequency of said signal pulses coupled to the input of said up/down counter means to increase the resolution of said up/down counter means so that the output of said counter means is more sensitive to a rate of change in the parameter value to be displayed.

10. A tachometer comprising a digital read-out meter circuit having a variable meter data update rate, said circuit including a digital read-out meter having counters with an input for receiving signal pulses having a frequency representative of engine rpm to be displayed by said meter, and having a counter reset terminal and a data update strobe terminal, up/down counter means having an input for receiving a series of pulses having a frequency representative of engine rpm, and operative for providing an output representative of the rate of change in the engine rpm, and logic circuit means subject to said up/down counter means output for controlling selective application of different frequency data update pulses to said data update strobe terminal to provide said meter with a variable data update rate.

11. A tachometer in accordance with claim 10, further comprising frequency multiplier means for receiving "X" number of pulses per engine revolution and for multiplying the frequency of said "X" number of pulses to generate said signal pulses which are coupled to said input of said meter counters, said signal pulses being generated so as to have a frequency so that engine rpm is counted and can be read out directly by said meter.

12. A tachometer in accordance with claim 11 wherein said meter counters count for a given time period, and wherein said frequency multiplier means is adjustable and operative for multiplying said "X" number of pulses per engine revolution so that, for said given time period, the engine rpm is counted and can be read out directly by said meter.

13. A tachometer in accordance with claim 12 wherein said meter includes a fixed one's digit counter, and a ten's digit counter having an input for receiving said signal pulses, and wherein said frequency multiplier means includes switching means and is operable for multiplying said "X" number of pulses per engine revolution so that engine rpm can be read out directly by said meter and wherein said "X" number of pulses per engine revolution is equal to one of, two pulses per engine revolution, three pulses per engine revolution, four pulses per engine revolution, and six pulses per engine revolution.

14. A tachometer in accordance with claim 13 wherein said frequency multiplier comprises a phase-locked loop having an input for receiving said "X" number of pulses per engine revolution and having an output for generating said signal pulses, said frequency multiplier means further comprising frequency divider means coupled to said phase-locked loop and including said switching means operative so that the frequency of the output of the phase-locked loop is equal to a variable number "N" times said "X" number of pulses per engine revolution, so that engine rpm is counted and can be read out directly by said meter.

15. A tachometer in accordance with claim 14 wherein said up/down counter means is operative subject to a reset signal, for counting up for $\frac{1}{2}$ of a predetermined counting interval, and for counting down for $\frac{1}{2}$ of the predetermined interval.

16. A tachometer in accordance with claim 15 wherein said up/down counter means is presetable and has a preset count number, and wherein said logic circuit means is operable for allowing application of first frequency data update pulses to said data update strobe terminal to provide said meter with a first data update rate when said counter means counts down through zero or has a count in excess of twice the predetermined count number, and for allowing application of second frequency data update pulses to said data update strobe terminal to provide said meter with a second data update rate when said counter means has a count in the range of zero to twice the predetermined count number.

17. A tachometer in accordance with claim 16 wherein said digital read-out meter circuit further includes an oscillator, and logic circuit processing means for generating said reset signal and for generating said first frequency data update pulses and said second frequency data update pulses, said processing means including AND/OR select gate means, subject to application of a control signal from said logic circuit means, for selectively coupling one of said first frequency data update pulses and said second frequency data update pulses to said data update strobe terminal so that said meter has a fast update rate when the rate of change of rpm exceeds a predetermined limit, and so that said meter has a slow data update rate when the rate of change of said rpm does not exceed said predetermined upper limit.

18. A tachometer in accordance with claim 17 wherein said predetermined count number is 2, and wherein said logic circuit means applies a control signal to said AND/OR select gate means so that said first frequency data update pulses are applied to said data update strobe terminal so that said meter has a fast data update rate when said counter counts through zero or has a count equal to or greater than five.

19. A tachometer in accordance with claim 18 further comprising second frequency multiplier means for increasing the frequency of said "X" number of pulses per engine revolution coupled to the input of said up/down counter means to increase the resolution of said up/down counter means so that the output of said counter means is more sensitive to a rate of change in engine rpm.

20. A tachometer comprising a digital read-out meter circuit having a variable meter data update rate, said circuit including a digital read-out meter having counters which count subject to a given frequency reset signal for a given time period and with an input for receiving signal pulses having a frequency proportional to engine rpm to be displayed by said meter, and having a counter reset terminal and a date update strobe terminal, frequency multiplier means for receiving "X" number of pulses per engine revolution and for multiplying the frequency of said "X" number of pulses to generate said signal pulses which are coupled to said input of said meter counters, said frequency multiplier means including adjustable switching means operative so that said signal pulses are generated so as to have a frequency so that for said given time period engine rpm is counted and can be read out directly by said meter, up/down counter means having an input coupled to said signal pulses, and an output representative of the rate of change of engine rpm to be displayed, said up/down counter means being presetable and having a preset count number, and being operable, subject to said reset signal, for counting up for ½ of a predetermined counting interval established by said reset signal, and counting down for ½ of the predetermined counting interval, and logic circuit means coupled to the output of said up/down counter means and operable for allowing application of first frequency data update pulses to said data update strobe terminal to provide said meter with a first data update rate when said counter means counts down through zero or has a count in excess of twice the predetermined count number, and for allowing application of second frequency data update pulses to said data update strobe terminal to provide said meter with a second data update rate when said counter means has a count in the range of zero to twice the predetermined count number.

21. A tachometer in accordance with claim 20 wherein said meter includes a fixed one's digit counter, and a ten's digit counter having an input for receiving said signal pulses, and wherein said frequency multiplier means including switching means is selectively operable for multiplying said "X" number of pulses per engine revolution so that engine rpm can be read out directly by said meter and wherein said "X" number of pulses per engine revolution is equal to one of, two pulses per engine revolution, three pulses per engine revolution, four pulses per engine revolution, and six pulses per engine revolution.

22. A tachometer in accordance with claim 20 wherein said digital read-out meter circuit further includes an oscillator, and logic circuit processing means for generating said reset signal and for generating said first frequency data update pulse and said second frequency data update pulses, said processing means including AND/OR select gate means, subject to application of a control signal from said logic circuit means, for selectively coupling one of said first frequency data update pulses and said second frequency data update pulses to said data update strobe terminal so that said meter has a fast update rate when the rate of change of rpm exceeds a predetermined limit, and so that said meter has a slow data update rate when the rate change of said rpm does not exceed said predetermined upper limit.

23. A tachometer in accordance with claim 22 wherein said predetermined count number is 2, and wherein said logic circuit means applies a control signal to said AND/OR select gate means so that said first frequency data update pulses are applied to said data update strobe terminal so that said meter has a fast data update rate when said counter counts through zero or has a count equal to or greater than five.

24. A tachometer in accordance with claim 23 further comprising second frequency multiplier means for increasing the frequency of said "X" number of pulses per engine revolution coupled to the input of said up/down counter means to increase the resolution of said up/down counter means so that the output of said counter means is more sensitive to a rate of change in engine rpm.

* * * * *